US012743390B2

(12) United States Patent
Guo

(10) Patent No.: US 12,743,390 B2
(45) Date of Patent: Sep. 22, 2026

(54) CIRCUIT BOARD OF GRAPHICS PROCESSING UNIT AND SERVER SYSTEM

(71) Applicant: SUZHOU METABRAIN INTELLIGENT TECHNOLOGY CO., LTD., Suzhou (CN)

(72) Inventor: Boya Guo, Suzhou (CN)

(73) Assignee: SUZHOU METABRAIN INTELLIGENT TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 19/139,143

(22) PCT Filed: Apr. 16, 2024

(86) PCT No.: PCT/CN2024/088058
§ 371 (c)(1),
(2) Date: Jun. 13, 2025

(87) PCT Pub. No.: WO2025/112271
PCT Pub. Date: Jun. 5, 2025

(65) Prior Publication Data

US 2026/0030192 A1 Jan. 29, 2026

(30) Foreign Application Priority Data

Dec. 1, 2023 (CN) ......................... 202311634161.1

(51) Int. Cl.
*G06F 13/40* (2006.01)
*G06T 1/20* (2006.01)
(Continued)

(52) U.S. Cl.
CPC ........ *G06F 13/4022* (2013.01); *G06F 13/409* (2013.01); *H05K 7/10* (2013.01); *H05K 7/1485* (2013.01); *G06F 2213/0026* (2013.01)

(58) Field of Classification Search
CPC ............... G06F 13/4022; G06F 13/409; G06F 2213/0026; H05K 7/10; H05K 7/1485
(Continued)

(56) References Cited

U.S. PATENT DOCUMENTS 6,505,263 B1 * 1/2003 Larson .................. G06F 13/385 710/305
7,782,325 B2 * 8/2010 Gonzalez ............ G06F 13/4068 710/21
(Continued)

FOREIGN PATENT DOCUMENTS

CN 108845970 A 11/2018
CN 109002591 A 12/2018
(Continued)

OTHER PUBLICATIONS

The search report of CN application No. 202311634161.1 issued on Jan. 4, 2024.
(Continued)

*Primary Examiner* — Idriss N Alrobaye
*Assistant Examiner* — Henry W Yu
(74) *Attorney, Agent, or Firm* — Scully, Scott, Murphy & Presser, P.C.

(57) ABSTRACT

The present disclosure provides a circuit board of a graphics processing unit. A first connector, a second connector, a third connector, a fourth connector, a first switch chip, a second switch chip, a first slot set comprising (M+P) slots, and a second slot set comprising N slots are deployed on the circuit board, wherein N is equal to (M+P). The first switch chip is connected to the first connector, the third connector and M slots in the first slot set, the second switch chip is connected to the fourth connector and N slots in the second slot set, and the second connector is connected to P slots in the first slot set. The first connector is connected to a central
(Continued)

processing unit; the second connector is connected to the third connector; and the third connector is connected to the second connector or the fourth connector.

19 Claims, 5 Drawing Sheets

(51) Int. Cl.
*H05K 7/10* (2006.01)
*H05K 7/14* (2006.01)

(58) Field of Classification Search
USPC ........................ 710/1, 8, 15, 29, 38, 51, 306
See application file for complete search history.

(56) References Cited

U.S. PATENT DOCUMENTS 10,381,758 B1* 8/2019 Scanlon ............... H01R 12/716
10,398,032 B1* 8/2019 Bailey ..................... G06F 11/20
2002/0109688 A1* 8/2002 Olarig ................. G06F 12/1081 345/531
2005/0270298 A1* 12/2005 Thieret ................. G06F 13/409 345/502
2009/0276554 A1* 11/2009 Lee ..................... G06F 13/4059 710/301
2015/0347345 A1* 12/2015 Hellriegel ............. G06F 13/409 710/301
2017/0322899 A1* 11/2017 Ni ....................... G06F 13/4022

FOREIGN PATENT DOCUMENTS

CN 109993685 A 7/2019
CN 210038633 U 2/2020
CN 112069107 A 12/2020
CN 112765074 A 5/2021
CN 115639880 A 1/2023
CN 219574741 U 8/2023
CN 117333348 A 1/2024
WO 2016037503 A1 3/2016

OTHER PUBLICATIONS

The search report of PCT application No. PCT/CN2024/088058 issued on Aug. 6, 2024.

* cited by examiner

CIRCUIT BOARD OF GRAPHICS PROCESSING UNIT AND SERVER SYSTEM

CROSS-REFERENCE TO RELATED APPLICATION

This application claims priority to Chinese Patent Application No. 202311634161.1, filed to the China National Intellectual Property Administration on Dec. 1, 2023 and entitled “Circuit Board of Graphics Processing Unit and Server System”, which is incorporated herein by reference in its entirety.

TECHNICAL FIELD

Some embodiments of the present disclosure relate to the field of computers, and in particular, to a circuit board of a graphics processing unit and a server system.

BACKGROUND

In recent years, GPUs (Graphics Processing Unit) have been widely utilized in fields such as computer gaming, film and television special effects, scientific computing, and machine learning due to their great parallel computing capabilities. For servers, multiple GPUs are required to handle complex computational demands to ensure algorithmic efficiency. In different application scenarios, multiple GPUs need to use different machine topology structures. Consequently, the switching of GPU connection topology structures on servers occurs frequently. At present, GPUs on servers are interconnected via complex cables. When switching between different topology structures, it is necessary to manually reconnect the cables. This operation process involves a plurality of cables of varying lengths, requiring cables of different models for specific machine types. The operation is relatively complex, and the intricate connection procedures are prone to causing cable damage as well as damage to GPU board interfaces.

SUMMARY

Some embodiments of the present disclosure provide a circuit board of a graphics processing unit and a server system, so as to at least solve the problem in the related art that cables and interfaces are easily damaged due to complex operations of switching machine topologies.

According to an embodiment of the present disclosure, a circuit board of a graphics processing unit is provided, wherein a connector set, a switch chip set and a device slot set are deployed on the circuit board, the connector set includes a first connector, a second connector, a third connector and a fourth connector, the switch chip set includes a first switch chip and a second switch chip, and the device slot set includes a first slot set and a second slot set, wherein the first slot set includes (M+P) device slots, and the second slot set includes N device slots, N is equal to M+P; the first switch chip is connected to the first connector, the third connector and M device slots in the first slot set via traces the circuit board respectively, the second switch chip is connected to the fourth connector and the N device slots in the second slot set via the traces of the circuit board respectively, and the second connector is connected to P device slots in the first slot set via the traces of the circuit board; the first connector is configured to be connected to a central processing unit; the second connector is configured to be connected to the third connector; the third connector is configured to be connected to the second connector or the fourth connector; the fourth connector is configured to be connected to the third connector or a central processing unit; and the device slot set is configured to be connected to the graphics processing unit.

Optionally, the second connector, the third connector, and the fourth connector are all board-to-board connectors, the second connector, the third connector, and the fourth connector are arranged in a straight line, and face a same direction, and a distance between the second connector and the third connector, and a distance between the third connector and the fourth connector are both a target distance.

Optionally, connectors in the connector set are connected with each other via a connector circuit board, wherein a fifth connector and a sixth connector are deployed on a same side of the connector circuit board, the fifth connector and the sixth connector are connected via a trace of the circuit board, the fifth connector and the sixth connector are both board-to-board connectors, and a distance between the fifth connector and the sixth connector is the target distance.

Optionally, the connector circuit board is configured to slide on the circuit board of the graphics processing unit, to switch between, a connection between the third connector and the second connector, and a connection between the third connector and the fourth connector, by means of sliding.

Optionally, the connector circuit board is configured to allow plugging and unplugging operations, to connect the third connector to the second connector, or connect the third connector to the fourth connector.

Optionally, connectors in the connector set are connected with each other via a connection cable including two connection heads, wherein a first connection head of the connection cable is connected to the third connector, and a second connection head of the connection cable is configured to be connected to the second connector or the fourth connector.

Optionally, the connection between the second connector and the third connector is configured to form a balanced topology structure or a common topology structure of the graphics processing unit.

Optionally, the second connector is connected to the third connector, and the first connector and the fourth connector are connected to different central processing units, to form the balanced topology structure.

Optionally, the second connector is connected to the third connector, and the first connector and the fourth connector are connected to a same central processing unit, to form the common topology structure.

Optionally, the connection between the third connector and the fourth connector is configured to form a cascade topology structure of the graphics processing unit.

Optionally, the third connector is connected to the fourth connector, and the first connector is connected to the central processing unit, form a cascade topology structure.

Optionally, M is equal to (N−1), and P is equal to 1.

Optionally, N is equal to 5.

According to another embodiment of the present disclosure, a server system is provided, the server system includes: a central processing unit set, a circuit board of a graphics processing unit and a graphics processing unit set, wherein the circuit board of the graphics processing unit is connected between the central processing unit set and the graphics processing unit set;

a connector set, a switch chip set and a device slot set are deployed on the circuit board of the graphics processing unit, wherein the connector set includes a first connector, a second connector, a third connector and a fourth connector, the switch chip set includes a first switch chip and a second switch chip, and the device slot set includes a first slot set and a second slot set, wherein the first slot set includes (M+P) device slots, and the second slot set includes N device slots, N is equal to (M+P);

the first switch chip is connected to the first connector, the third connector, and M device slots in the first slot set via traces of the circuit board respectively, the second switch chip is connected to the fourth connector and the N device slots in the second slot set via the traces of the circuit board respectively, and the second connector is connected to P device slots in the first slot set via the traces of the circuit board;

the first connector is configured to be connected to a central processing unit in the central processing unit set; the second connector is configured to be connected to the third connector; the third connector is configured to be connected to the second connector or the fourth connector; the fourth connector is configured to be connected to the third connector or a central processing unit in the central processing unit set; and the device slot set is configured to be connected to a graphics processing unit in the graphics processing unit set.

Optionally, the second connector is connected to the third connector, the first connector is connected to a first central processing unit in the central processing unit set, and the fourth connector is connected to a second central processing unit in the central processing unit set, to form a balanced topology structure of the graphics processing unit set.

Optionally, the second connector is connected to the third connector, and the first connector and the fourth connector are both connected to a third central processing unit in the central processing unit set, to form a common topology structure of the graphics processing unit set.

Optionally, the third connector is connected to the fourth connector, and the first connector is connected to a fourth central processing unit in the central processing unit set, to form a cascade topology structure of the graphics processing unit set.

Optionally, the server system further includes a connector circuit board, wherein the second connector, the third connector and the fourth connector are all board-to-board connectors, the second connector, the third connector and the fourth connector are arranged in a straight line, and face a same direction, and a distance between the second connector and the third connector, and a distance between the third connector and the fourth connector are both a target distance; and connectors in the connector set are connected with each other via the connector circuit board, wherein a fifth connector and a sixth connector are disposed on a same side of the connector circuit board, the fifth connector and the sixth connector are connected via a trace of the circuit board, the fifth connector and the sixth connector are both board-to-board connectors, and a distance between the fifth connector and the sixth connector is the target distance.

Optionally, the connector circuit board is configured to slide on the circuit board of the graphics processing unit, to switch between, a connection between the third connector and the second connector, and a connection between the third connector and the fourth connector, by means of sliding.

Optionally, the connector circuit board is configured to allow plugging and unplugging operations, to connect the third connector to the second connector, or connect the third connector to the fourth connector.

By means of the present disclosure, a circuit board for connecting a graphics processing unit and a central processing unit is provided, and a connector set, a switch chip set and a device slot are deployed on the circuit board, the connector set includes a first connector, a second connector, a third connector and a fourth connector, the switch chip set includes a first switch chip and a second switch chip, and the device slot set includes a first slot set and a second slot set; some elements on the circuit board are connected via traces of the circuit board, the first switch chip is connected to the first connector, the third connector, and M device slots in the first slot set via traces of the circuit board respectively, the second switch chip is connected to the fourth connector and N device slots in the second slot set via traces of the circuit board respectively, and the second connector is connected to P device slots in the first slot set via traces of the circuit board respectively; in addition, the first connector is configured to be connected to the central processing unit, the second connector is configured to be connected to the third connector, the third connector is configured to be connected to the second connector or the fourth connector, and the fourth connector is configured to be connected to the third connector or the central processing unit, thus the structure of the circuit board of the graphics processing unit may be simplified on the premise of satisfying the requirements of the connection topology structure of the graphics processing unit, it may be possible to solve the problem that the complexity of a switching operation of the connection topology structure of a plurality of graphics processing units on the server is relatively high, and achieve the effect of reducing the complexity of the switching operation of the connection topology structure of a plurality of graphics processing units on the server.

DETAILED DESCRIPTION OF THE EMBODIMENTS

Embodiments of the present disclosure will be described below in detail with reference to the accompanying drawings and in conjunction with the embodiments.

It should be noted that the terms "first", "second" etc., in the description, claims, and accompanying drawings of the present disclosure are used to distinguish similar objects, and are not necessarily used to describe a specific sequence or order.

Figure 1:
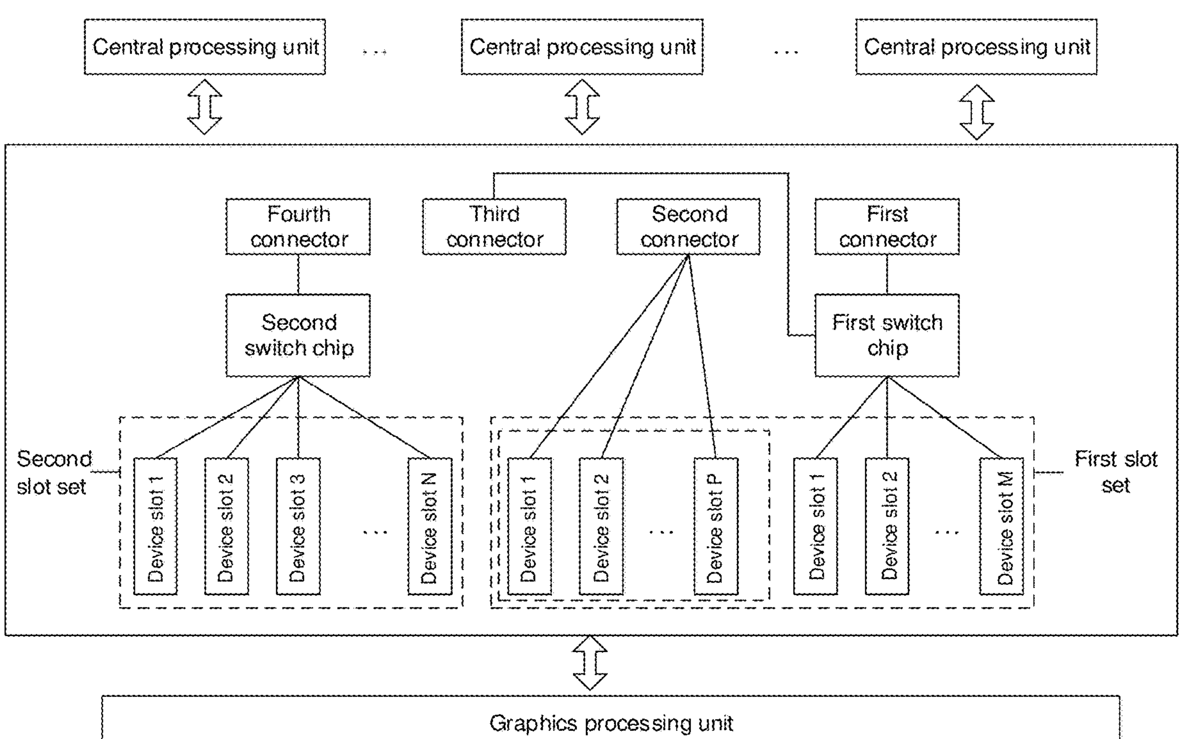
FIG. 1 is a schematic diagram of a circuit board of a graphics processing unit according to an embodiment of the present disclosure.

An embodiment of the present disclosure provides a circuit board of a graphics processing unit. FIG. 1 is a schematic diagram of a circuit board of a graphics processing unit according to an embodiment of the present disclosure. As shown in FIG. 1, a connector set, a switch chip set, and a device slot set are deployed on the circuit board, wherein the connector set includes a first connector, a second connector, a third connector and a fourth connector, the switch chip set includes a first switch chip and a second switch chip, and the device slot set includes a first slot set and a second slot set, wherein the first slot set includes (M+P) device slots, and the second slot set includes N device slots, N being equal to (M+P);

the first switch chip is connected to the first connector, the third connector and M device slots in the first slot set via traces of the circuit board respectively, the second switch chip is connected to the fourth connector and N device slots in the second slot set via traces of the circuit board respectively, and the second connector is connected to the P device slots in the first slot set via traces of the circuit board;

the first connector is configured to be connected to a first central processing unit; the second connector is configured to be connected to the third connector; the third connector is configured to be connected to the second connector or the fourth connector; the fourth connector is configured to be connected to the third connector or a second central processing unit; and the device slot set is configured to be connected to the graphics processing unit; the first central processing unit and the second central processing unit may be a same central processing unit or different central processing units.

By means of the above design, a circuit board for connecting a graphics processing unit and a central processing unit is provided, and a connector set, a switch chip set and a device slot set are deployed on the circuit board, the connector set includes a first connector, a second connector, a third connector and a fourth connector, the switch chip set includes a first switch chip and a second switch chip, and the device slot set includes a first slot set and a second slot set; some elements on the circuit board are connected via traces of the circuit board, the first switch chip is connected to the first connector, the third connector, and M device slots in the first slot set via traces of the circuit board respectively, the second switch chip is connected to the fourth connector and N device slots in the second slot set via traces of circuit board respectively, and the second connector is connected to P device slots in the first slot set via traces of the circuit board respectively; in addition, the first connector is configured to be connected to the first central processing unit, the second connector is configured to be connected to the third connector, the third connector is configured to be connected to the second connector or the fourth connector, and the fourth connector is configured to be connected to the third connector or the second central processing unit, thus the structure of the circuit board of the graphics processing unit may be simplified on the premise of satisfying the requirements of the connection topology structure of the graphics processing unit, it may be possible to solve the problem that the complexity of a switching operation of the connection topology structure of a plurality of graphics processing units on a server is relatively high, and achieve the effect of reducing the complexity of the switching operation of the connection topology structure of a plurality of graphics processing units on the server.

Optionally, in the embodiments of the present disclosure, a port of the circuit board on a side of the connector set is configured to be connected to the central processing unit, a port of the circuit board on a side of the device slot set is configured to be connected to the graphics processing unit, and the device slot set includes a plurality of device slots for connecting to the graphics processing unit, so as to achieve connection between the central processing unit and a plurality of graphics processing units.

Optionally, in the embodiments of the present disclosure, in order to implement different connection topology structures of the graphics processing unit, the connection relationships among the second connector, the third connector and the fourth connector may be changed, so as to achieve different connection topology requirements of the graphics processing unit.

Optionally, in the embodiments of the present disclosure, the second connector, the third connector, and the fourth connector may be arranged in a straight line on the circuit board in sequence. The second connector, the third connector, and the fourth connector may be connected via a cable or alternatively via a connection device. For example, the second connector, the third connector, and the fourth connector adopt a connector (such as a board-to-board connector) having an external connection interface; in this case, the connection device may be a connection device provided with two connection interfaces, and the connection interfaces on the connection device are configured to be connected to external connection interfaces on the connectors. For example, the connection device may be a connection cable that includes two connection heads, wherein a first connection head of the connection cable is configured to be connected to the third connector, and a second connection head of the connection cable is configured to be connected to the second connector or the fourth connector, the connection topologies of the graphics processing unit may be switched by switching the connection relationship between the second connection head and the second connector or the fourth connector. The connector may also be a connection board including two connection heads, and in this case, the second connector, the third connector, and the fourth connector are arranged in a straight line, furthermore, the second connector, the third connector and the fourth connector are arranged in an equal distance, and a distance between two connection heads on the connection board is equal to a distance between the third connector and the second connector or a distance between the third connector and the fourth connector. In use, the connection topology structure of the graphics processing unit may be changed by changing the connection relationship between the connection board and the second connector, the third connector and the fourth connector. Alternatively, the connection board may be configured to slide on the circuit board, and by sliding the connection board between the second connector, the third connector, and the fourth connector, the connection topology structure of the graphics processing unit may be changed by changing the connection relationship of the connection board between the second connector, the third connector, and the fourth connector.

Optionally, in the embodiments of the present disclosure, the circuit board of the graphics processing unit supports eight ×16 GPUs and a GPU board of two ×16 network cards, and supports three topology forms of balance, cascade, and common. The foregoing switch chip includes two 96 lane PCIe (Peripheral Component Interconnect Express) switch (96 lane PCIe switch) chips.

As an optional embodiment, the second connector, the third connector, and the fourth connector are all board-to-board connectors, the second connector, the third connector, and the fourth connector are arranged in a straight line, and face the same direction, and the distance between the second connector and the third connector and the distance between the third connector and the fourth connector are both a target distance.

Optionally, in an embodiment of the present disclosure, the board-to-board connector may be a vertical connector or a right angle connector.

Optionally, in an embodiment of the present disclosure, the board-to-board connector may be an MCIO (Mini Cool Edge IO) connector or a gen-z connector.

Optionally, in an embodiment of the present disclosure, the distance between the third connector and the second connector is equal to the distance between the third connector and the fourth connector, and the second connector, the third connector and the fourth connector face the same direction, and the specifications of the connection devices used for connecting the third connector and the second connector, and for connecting the third connector and the fourth connector are unified, thus connection devices of a same specification may be configured. The connection devices may be connected to different connectors under different topology structures of the graphics processing unit, so as to satisfy different topological requirements of the graphics processing unit, and simplify the operation structure of the circuit board of the graphics processing unit.

As an optional embodiment, connectors in a connector set are connected via a connector circuit board, wherein a fifth connector and a sixth connector are deployed on a same side of the connector circuit board, the fifth connector and the sixth connector are connected via a circuit board trace, the fifth connector and the sixth connector are both board-to-board connectors, and a distance between the fifth connector and the sixth connector is a target distance.

Optionally, in an embodiment of the present disclosure, the connector circuit board may allow plugging and unplugging operations, to connect the third connector to the second connector, or connect the third connector to the fourth connector. Alternatively, the connector circuit board may also be configured to slide on the circuit board of the graphics processing unit. In use, the connection between the third connector and the second connector may be switched to the connection between the third connector and the fourth connector by means of sliding, which is not limited in the present disclosure.

Figure 2:
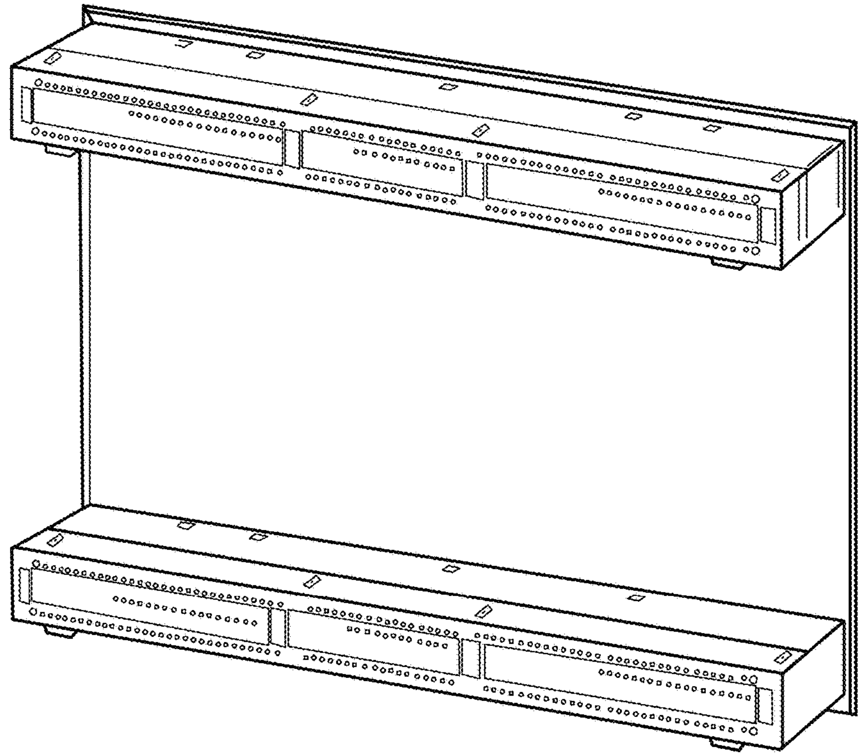
FIG. 2 is a schematic diagram of a bridge according to an embodiment of the present disclosure.

Optionally, in an embodiment of the present disclosure, FIG. 2 is a schematic diagram of a bridge according to an embodiment of the present disclosure. As shown in FIG. 2, the fifth connector and the sixth connector are two board-to-board connectors, and the fifth connector and the sixth connector are welded on one PCB and are connected by a ×16 PCIe signal. The distance between the fifth connector and the sixth connector is equal to the distance between the second connector and the third connector. On a bridge PCB, the data transmission (TX) and reception (RX) can be designed to allow the direction of data transmission to be changed (reversal) by altering the connection configuration, facilitating GPU board routing.

Optionally, in an embodiments of the present disclosure, the bridge includes, but is not limited to, a bridge that may use a 4C connector (an SFF-TA-1002 (an edge connector system)), which is not limited in the present disclosure.

By means of the above content, a fifth connector and a sixth connector are arranged on the connector circuit board, and the distance between the fifth connector and the sixth connector is a target distance. Furthermore, the fifth connector and the sixth connector are both board-to-board connectors, so that the connection between the second connector and the third connector may be achieved via the connector circuit board through plugging and unplugging operations, and the connection between the third connector and the fourth connector may be achieved via the connector circuit board, so that the topology structures of the graphics processing unit is changed by plugging and unplugging of different connectors on the same connector circuit board.

As an optional embodiment, a connection structure between the second connector and the third connector is configured to form a balanced topology structure or a common topology structure for the graphics processing unit.

Optionally, in an embodiment of the present disclosure, the balanced topology structure and the common topology structure are both implemented by connecting the second connector and the third connector, and the difference lies in that the first connector and the fourth connector in the balanced topology structure are connected to different central processing units, while the first connector and the fourth connector in the common topology structure are connected to a same central processing unit.

By means of the content above, by connecting the second connector and the fourth connector, the functions of the balanced topology structure and the common topology structure may be implemented, so that in practical use, the number of external wires may be effectively simplified for the two topology structures, thereby simplifying the change operation of the two topology structures.

As an optional embodiment, the second connector is connected to the third connector, and the first connector and the fourth connector are respectively connected to different central processing units to form a balanced topology structure.

Optionally, in an embodiment of the present disclosure, a connection manner between the first connector and the first central processing unit may be a cable connection, a connection manner between the fourth connector and the second central processing unit may be a cable connection, and a connection wire may be configured at ports of the first connector and the fourth connector on the circuit board, the other end of the connection wire is connected to the corresponding processor, achieving the function of the balanced topology structure.

Figure 3:
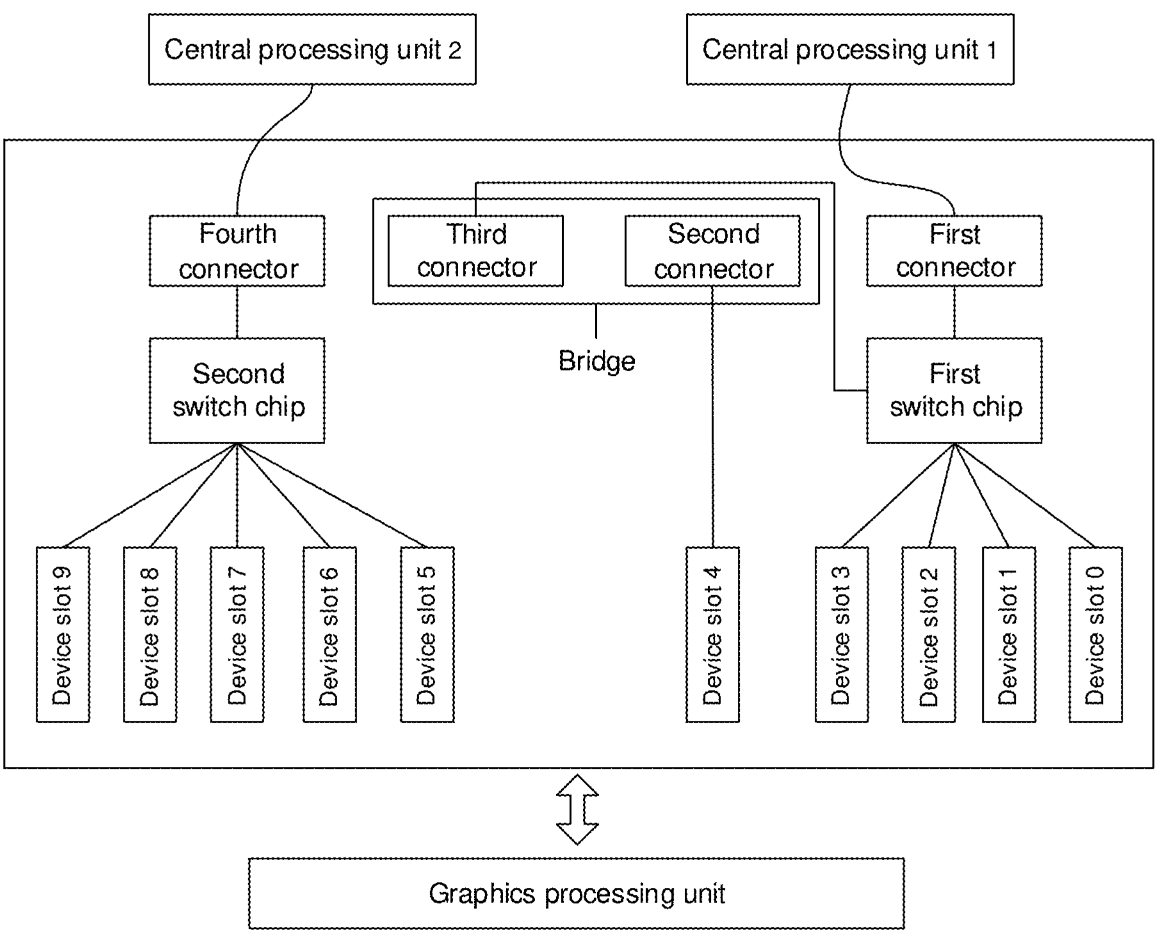
FIG. 3 is a schematic diagram of an optional balanced topology structure according to an embodiment of the present disclosure.

FIG. 3 is a schematic diagram of an optional balanced topology according to an embodiment of the present disclosure. As shown in FIG. 3, two PCIe switch chips on the circuit board constitute a switch chip set, i.e. PCIe switch 0 (first switch chip) and PCIe switch 1 (second switch chip). The four connectors constitute a connector set, i.e. C0 connector (first connector), C1 (second connector), C2 (third connector), C3 connector (fourth connector). Ten ×16 PCIe slots constitute a device slot set, wherein the PCIe switch chips should at least support a 96 lane PCIe signal, wherein C1, C2 and C3 are arranged in a straight line and face the same direction, and the distance between C1 and C2 is equal to the distance between C2 and C3. The ten ×16 PCIe slots are sequentially denoted as slot 0 to slot 9. The PCIe switch 0 is connected to slot 0 to slot 3 via a ×16 PCIe signal; the PCIe switch 0 is connected to C0 and C2 via a ×16 PCIe signal; the PCIe switch 1 is connected to slot 6 to slot 9 via a ×16 PCIe signal; the PCIe switch 1 is connected to C3 via a ×16 PCIe signal; and C1 is connected to Slot 4 via a ×16 PCIe signal. When designed as a balanced topology, a C0 connector (first connector) on the GPU board is connected to the CPU0 via a cable, a C3 connector (fourth connector) is connected to the CPU1 via a cable, and two connectors (fifth connector and sixth connector) on the bridge (connector circuit board) are correspondingly connected to a C1 connector (second connector) and a C2 connector (third connector) on the GPU board respectively. In an embodiment of the present disclosure, the connector circuit board includes two board-to-board connectors, and the board-to-board connectors and C0 to C3 on the GPU board are in a matching relationship and may be connected to each other. The two board-to-board connectors are welded on a Printed Circuit Board (PCB) and are connected via a ×16 PCIe signal; and the distance between the two board-to-board connectors is equal to the distance between C1 and C2 on the GPU board. Optionally, the TX and RX on the bridge PCB may be designed to be reversal, facilitating GPU board routing.

As an optional embodiment, the second connector is connected to the third connector, and the first connector and the fourth connector are connected to the same central processing unit, so as to form a common topology structure.

Figure 4:
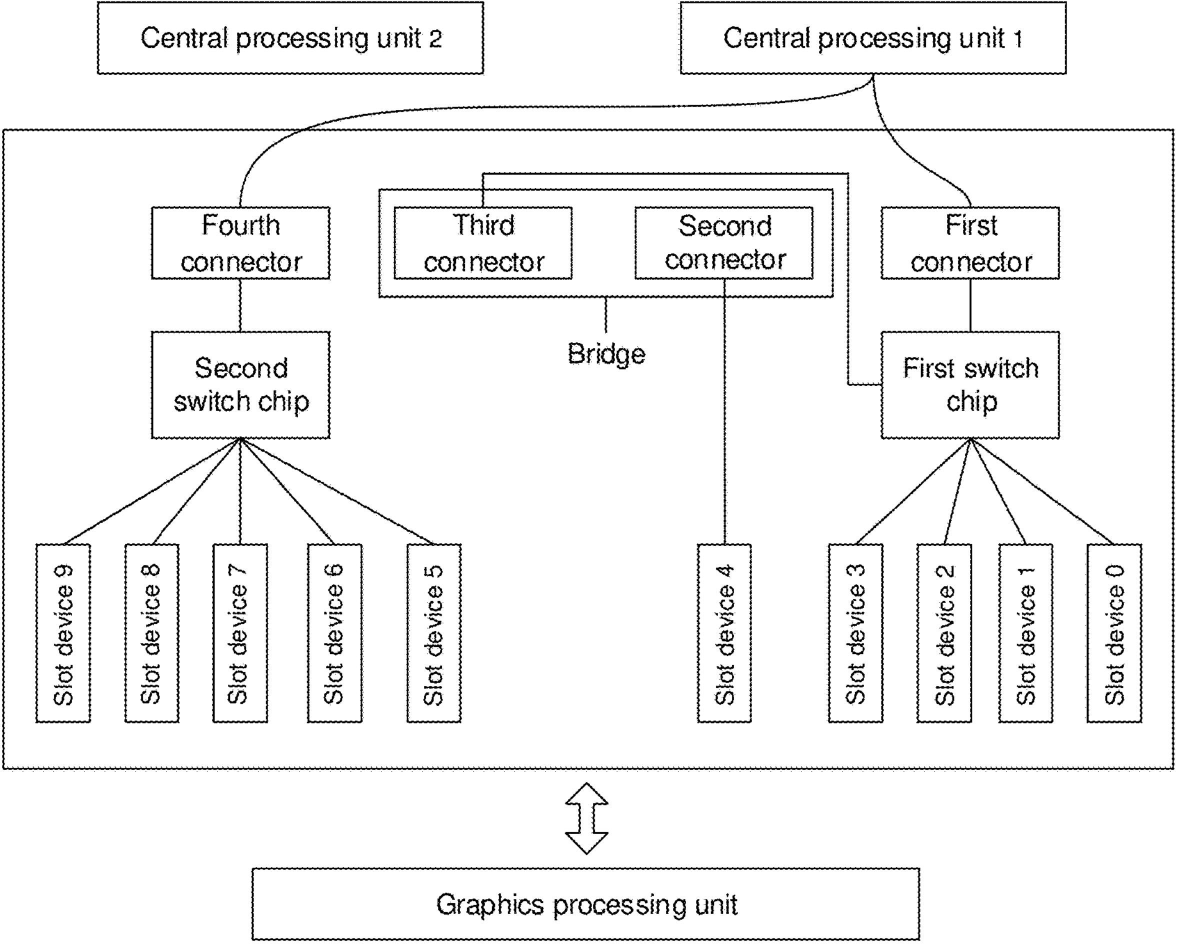
FIG. 4 is a schematic diagram of an optional common topology structure according to an embodiment of the present disclosure.

FIG. 4 is a schematic diagram of an optional common topology structure according to an embodiment of the present disclosure. As shown in FIG. 4, two PCIe switch chips on the circuit board constitute a switch chip set, i.e. PCIe switch 0 (first switch chip) and PCIe switch 1 (second switch chip). The four connectors constitute a connector set, i.e. C0 connector (first connector), C1 (second connector), C2 (third connector), C3 connector (fourth connector). Ten ×16 PCIe slots constitute a device slot set, wherein the PCIe switch chips should at least support a 96 lane PCIe signal, wherein C1, C2 and C3 are arranged in a straight line, and face the same direction, and the distance between C1 and C2 is equal to the distance between C2 and C3. The ten ×16 PCIe slots are sequentially denoted as slot 0 to slot 9. The PCIe switch 0 is connected to slot 0 to slot 3 via a ×16 PCIe signal; the PCIe switch 0 is connected to C0 and C2 via a ×16 PCIe signal; the PCIe switch 1 is connected to slot 6 to slot 9 via a ×16 PCIe signal; the PCIe switch 1 is connected to C3 via a ×16 PCIe signal; and C1 is connected to Slot 4 via a ×16 PCIe signal. When designed as a cascade topology, the C0 connector on the GPU board is connected to the CPU0 via a cable, the C3 connector is not plugged into a cable, and two connectors on the bridge are connected to the C2 and C3 connectors on the GPU board respectively. In an embodiment of the present disclosure, the connector circuit board includes two board-to-board connectors, and the board-to-board connectors are in a matching relationship with C0 to C3 on the GPU board, and may be connected to each other. The two board-to-board connectors are welded on one PCB, and are connected via a ×16 PCIe signal; and the distance between the two board-to-board connectors is equal to the distance between C1 and C2 on the GPU board. Optionally, the TX and RX on the bridge PCB may be reversal, thereby facilitating GPU board routing.

As an optional embodiment, the connection between the third connector and the fourth connector is configured to form a cascade topology structure of the graphics processing unit.

As an optional embodiment, the third connector is connected to the fourth connector, and the first connector is connected to the first central processing unit, so as to form a cascade topology structure.

Figures 5, 6:
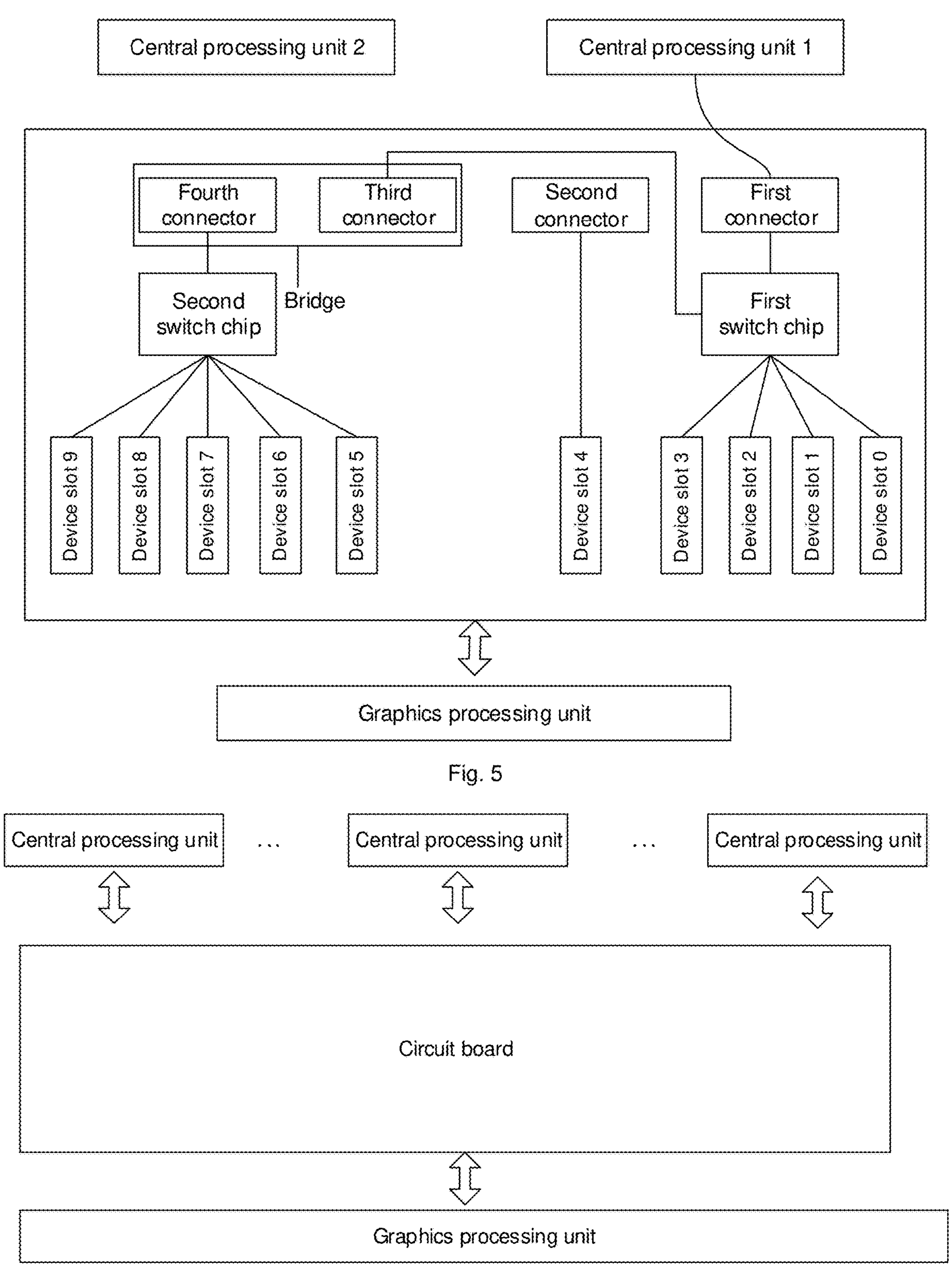
FIG. 5 is a schematic diagram of an optional cascade topology structure according to an embodiment of the present disclosure.
FIG. 6 is a schematic diagram of an optional server system according to an embodiment of the present disclosure.

FIG. 5 is a schematic diagram of an optional cascade topology structure according to an embodiment of the present disclosure. As shown in FIG. 5, two PCIe switch chips on the circuit board constitute a switch chip set, i.e. PCIe switch 0 (first switch chip) and PCIe switch 1 (second switch chip). The four connectors constitute a connector set, i.e. C0 connector (first connector), C1 (second connector), C2 (third connector), C3 connector (fourth connector). Ten ×16 PCIe slots constitute a device slot set, wherein the PCIe switch chips should at least support a 96 lane PCIe signal, wherein C1, C2 and C3 are arranged in a straight line, and face the same direction, and the distance between C1 and C2 is equal to the distance between C2 and C3. The ten ×16 PCIe slots are sequentially denoted as slot 0 to slot 9. The PCIe switch 0 is connected to Slot 0 to Slot 3 via a ×16 PCIe signal; the PCIe switch 0 is connected to C0 and C2 via a ×16 PCIe signal; the PCIe switch 1 is connected to slot 5 to slot 9 via a ×16 PCIe signal; the PCIe switch 1 is connected to C3 via a ×16 PCIe signal; and C1 is connected to slot 4 via a ×16 PCIe signal. When designed as a common topology, the C0 on the GPU board is connected to the CPU0 via a cable, the C3 is connected to the CPU0 via a cable, and the two connectors on the bridge are connected to the C1 and C2 on the GPU board respectively. In an embodiment of the present disclosure, the connector circuit board includes two board-to-board connectors, and the board-to-board connectors are in a matching relationship with C0 to C3 on the GPU board, and they may be connected to each other. The two board-to-board connectors are welded on one PCB, and are connected via a ×16 PCIe signal; and the distance between the two board-to-board connectors is equal to the distance between C1 and C2 on the GPU board. Optionally, the TX and RX on the bridge PCB may be reversal, thereby facilitating GPU board routing.

As an optional embodiment, M is equal to (N−1), and P is equal to 1.

As an optional embodiment, N is equal to 5.

In an exemplary embodiment of the present disclosure, a server system is provided, and the server system includes a central processing unit set, a circuit board of a graphics processing unit and a graphics processing unit set, wherein the circuit board of the graphics processing unit is connected between the central processing unit set and the graphics processing unit set;

a connector set, a switch chip set and a device slot set are deployed on the circuit board of the graphics processing unit, wherein the connector set includes a first connector, a second connector, a third connector and a fourth connector, the switch chip set includes a first switch chip and a second switch chip, and the device slot set includes a first slot set and a second slot set, wherein the first slot set includes (M+P) device slots, and the second slot set includes N device slots, N is equal to (M+P).

the first switch chip is connected to the first connector, the third connector and M device slots in the first slot set via traces of the circuit board, the second switch chip is connected to the fourth connector and N device slots in the second slot set via traces of the circuit board, and the second connector is connected to P device slots in the first slot set via traces of the circuit board;

the first connector is configured to be connected to a first central processing unit in the central processing unit set; the second connector is configured to be connected to the third connector; the third connector is configured to be connected to the second connector or the fourth connector; the fourth connector is configured to be connected to the third connector or a second central processing unit in the central processing unit set; and the device slot set is configured to be connected to a graphics processing unit in the graphics processing unit set.

By means of the design above, a circuit board for connecting a graphics processing unit and a central processing unit is provided, and a connector set, a switch chip set and a device slot set are deployed on the circuit board, the connector set includes a first connector, a second connector, a third connector and a fourth connector, the switch chip set includes a first switch chip and a second switch chip, and the device slot set includes a first slot set and a second slot set; some elements on the circuit board are connected via traces of the circuit board, the first switch chip is connected to the first connector, the third connector, and M device slots in the first slot set via traces of the circuit board, the second switch chip is connected to the fourth connector and N device slots in the second slot set via traces of the circuit board, and the second connector is connected to P device slots in the first slot set via traces of the circuit board; in addition, the first connector is configured to be connected to the first central processing unit, the second connector is configured to be connected to the third connector, the third connector is configured to be connected to the second connector or the fourth connector, and the fourth connector is configured to be connected to the third connector or the second central processing unit, thus the structure of the circuit board of the graphics processing unit may be simplified on the premise of satisfying the requirements of the connection topology structure of the graphics processing unit, thus it may be possible to solve a problem that the complexity of a switching operation of the connection topology structure of a plurality of graphics processing units on the server is relatively high, and achieve the effect of reducing the complexity of a switching operation of the connection topology structure of a plurality of graphics processing units on the server.

FIG. 6 is a schematic diagram of an alternative server system according to an embodiment of the present disclosure. As shown in FIG. 6, the server system includes a central processing unit set, a circuit board of a graphics processing unit and a graphics processing unit set, wherein the circuit board of the graphics processing unit is connected between the central processing unit set and the graphics processing unit set; a connector set, a switch chip set and a device slot set are deployed on the circuit board of the graphics processing unit, wherein the connector set includes a first connector, a second connector, a third connector and a fourth connector, the switch chip set includes a first switch chip and a second switch chip, and the device slot set includes a first slot set and a second slot set, wherein the first slot set includes (M+P) device slots, and the second slot set includes N device slots, N is equal to (M+P); the first switch chip is connected to the first connector, the third connector and M device slots in the first slot set via traces of the circuit board, the second switch chip is connected to the fourth connector and N device slots in the second slot set via traces of the circuit board, and the second connector is connected to P device slots in the first slot set via traces of the circuit board; the first connector is configured to be connected to the first central processing unit in the central processing unit set; the second connector is configured to be connected to the third connector; the third connector is configured to be connected to the second connector or the fourth connector; the fourth connector is configured to be connected to the third connector or the second central processing unit in the central processing unit set; and the device slot set is configured to be connected to a graphics processing unit in the graphics processing unit set.

Optionally, in an embodiment of the present disclosure, the port of the circuit board on the side of the connector set is configured to be connected to the central processing unit, the port of the circuit board on the side of the device slot set is configured to be connected to the graphics processing unit, and the device slot set includes a plurality of device slots for connecting to the graphics processing units, so as to achieve the connection between the central processing unit and a plurality of graphics processing units.

Optionally, in an embodiment of the present disclosure, in order to implement different connection topology structures of the graphics processing unit, the connection relationships among the second connector, the third connector and the fourth connector may be changed, so as to achieve different connection topology requirements of the graphics processing unit.

Optionally, in an embodiment of the present disclosure, the second connector, the third connector, and the fourth connector may be arranged in a straight line on the circuit board in sequence. The second connector, the third connector, and the fourth connector may be connected via a cable or alternatively via a connection device. For example, the second connector, the third connector, and the fourth connector may adopt a connector (such as a board-to-board connector) having an external connection interface. In this case, the connection device may be a connection device provided with two connection interfaces, and the connection interfaces on the connection device are configured to be connected to external connection interfaces on the connectors. For example, the connection device may be a connection cable that includes two connection heads, wherein a first connection head of the connection cable is connected to the third connector, and a second connection head of the connection cable is connected to the second connector or the fourth connector, the connection topologies of the graphics processing unit may be switched by switching the connection relationship between the second connector and the second connector or the fourth connector. The connector may also be a connection board including two connection heads, and in this case, the second connector, the third connector, and the fourth connector are arranged in a straight line, furthermore, the second connector, the third connector and the fourth connector are arranged in an equal distance, and the distance between two connection heads on the connection board is equal to the distance between the third connector and the second connector or the distance between the third connector and the fourth connector. In use, the connection topology structure of the graphics processing unit may be changed by changing the connection relationship between the connection board and the second connector, the third connector and the fourth connector. Alternatively, the connection board may be configured to slide on the circuit board, and by sliding the connection board between the second connector, the third connector, and the fourth connector, the connection topology structure of the graphics processing unit may be changed by changing the connection relationship of the connection board between the second connector, the third connector, and the fourth connector.

Optionally, in an embodiment of the present disclosure, the circuit board of the above graphics processing unit supports eight ×16 GPUs and a GPU board of two ×16 network cards, and supports three topology forms of balance, cascade, and common, and the foregoing switch chip includes two 96 lane PCIe switch chips.

As an optional embodiment, the second connector is connected to the third connector, the first connector is connected to a first central processing unit in the central processing unit set, and the fourth connector is connected to a second central processing unit in the central processing unit set, so as to form a balanced topology structure of the graphics processing unit set.

Optionally, in an embodiment of the present disclosure, when designed as a balanced topology structure, a C0 connector (first connector) on the GPU board is connected to the CPU0 via a cable, a C3 connector (fourth connector) is connected to the CPU1 via a cable, and two connectors on the bridge are correspondingly connected to a C1 connector (second connector) and a C2 connector (third connector) on the GPU board respectively.

As an optional embodiment, the second connector is connected to the third connector, and both the first connector and the fourth connector are connected to a third central processing unit in the central processing unit set, so as to form a common topology structure of the graphics processing unit set.

Optionally, in an embodiment of the present disclosure, when designed as a cascade topology (common topology structure), a C0 connector (first connector) on the GPU board is connected to the CPU0 via a cable, a C3 connector (fourth connector) is not plugged into a cable, and two connectors on the bridge are correspondingly connected to a C2 connector (third connector) and a C3 connector (fourth connector) on the GPU board respectively.

As an optional embodiment, the third connector is connected to the fourth connector, and the first connector is connected to a fourth central processing unit in the central processing unit set, so as to form a cascade topology structure of the graphics processing unit set.

Optionally, in an embodiment of the present disclosure, when designed as a common topology (cascade topology structure), a C0 connector (first connector) on the GPU board is connected to the CPU0 via a cable, a C3 connector (fourth connector) is connected to the CPU0 via a cable, and two connectors on the bridge are correspondingly connected to a C1 connector (second connector) and a C2 connector (third connector) on the GPU board respectively.

As an optional embodiment, the server system further includes a connector circuit board, wherein the second connector, the third connector and the fourth connector are all board-to-board connectors, the second connector, the third connector and the fourth connector are arranged in a straight line and face the same direction, and the distance between the second connector and the third connector and the distance between the third connector and the fourth connector are both a target distance; and connectors in the connector set are connected with each other via a connector circuit board, wherein a fifth connector and a sixth connector are disposed on a same side of the connector circuit board, the fifth connector and the sixth connector are connected via a trace of the circuit board, the fifth connector and the sixth connector are both board-to-board connectors, and the distance between the fifth connector and the sixth connector is a target distance.

Optionally, in an embodiment of the present disclosure, the connector circuit board may allow plugging and unplugging operations, to connect the third connector to the second connector, or connect the third connector to the fourth connector. Alternatively, the connector circuit board may also be configured to slide on the circuit board of the graphics processing unit. In use, the connection between the third connector and the second connector may be switched to the connection between the third connector and the fourth connector by means of sliding, which is not limited in the present disclosure.

Optionally, in an embodiment of the present disclosure, the bridge includes, but is not limited to, a bridge that may use a 4C connector (SFF-TA-1002), which is not limited in the present disclosure.

Figure 7:
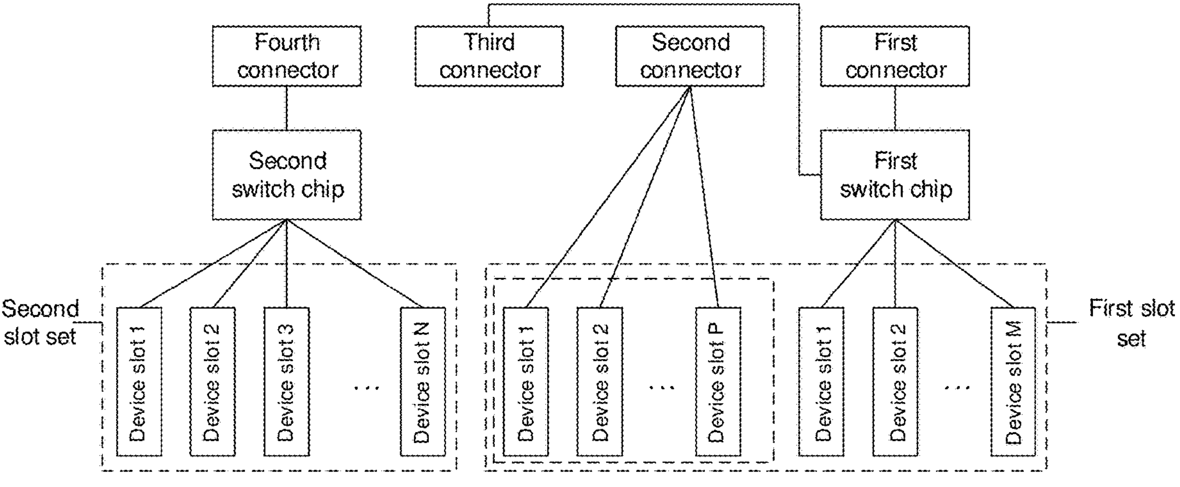
FIG. 7 is a detailed diagram of an optional circuit board according to the present disclosure.

FIG. 7 is a detailed diagram of an optional circuit board according to the present disclosure. As shown in FIG. 7, in an embodiment of the present disclosure, a GPU board supporting eight ×16 GPUs and two ×16 network cards, and a circuit board supporting three topology forms of balance, cascade and common are designed. In the design solution, the GPU board is designed to have two 96 lane PCIe switch chips, which are respectively denoted as PCIe switch 0 (first switch chip) and PCIe switch 1 (second switch chip). In the design solution, the GPU board is designed with four board-to-board connectors supporting a ×16 PCIe signal, which are respectively denoted as C0 (first connector) to C3. C1 (second connector), C2 (third connector) and C3 (fourth connector) are arranged in the same direction, and are located in a straight line, wherein C2 is in the middle, and C1 and C3 are located on two sides. Optionally, the board-to-board connector may be a vertical connector or a right angle connector. Optionally, the board-to-board connector may be an MCIO connector or a gen-z connector. In the design solution, the GPU board is designed to have ten ×16 PCIe slots, which are sequentially denoted as slot 0 to slot 9. Optionally, the slot for installing a GPU reserves a space for a double-width AIC (Add-In Card, a product form for solid-state drives). The PCIe switch 0 is connected to slot 0 to slot 3 via a ×16 PCIe signal; the PCIe switch 0 is connected to C0 and C2 via a ×16 PCIe signal; the PCIe switch 1 is connected to slot 6 to slot 9 via a ×16 PCIe signal; the PCIe switch 1 is connected to C3 via a ×16 PCIe signal; and C1 is connected to slot 4 via a ×16 PCIe signal. In this example, a bridge is also designed, and the bridge includes two board-to-board connectors, where the board-to-board connectors are in a matching relationship with C0 to C3 on the above GPU board, and they may be connected to each other. The two board-to-board connectors are welded on one PCB, and are connected via a ×16 PCIe signal; and the distance between the two board-to-board connectors is equal to the distance between C1 and C2 on the GPU board. Optionally, the TX and RX on the bridge PCB may be reversal, thereby facilitating GPU board routing. The bridge of a 4C connector (SFF-TA-1002) is used. When designed as a balanced topology, the C0 connector on the GPU board is connected to the CPU0 via a cable, the C3 connector is connected to the CPU1 via a cable, and the two connectors on the bridge are correspondingly connected to the C1 and C2 connectors on the GPU board respectively. When designed as a cascade topology, the C0 connector on the GPU board is connected to the CPU0 via a cable, the C3 connector is not plugged into a cable, and two connectors on the bridge are correspondingly connected to the C2 and C3 connectors on the GPU board respectively. When designed as a common topology, the C0 connector on the GPU board is connected to the CPU0 via a cable, the C3 connector is connected to the CPU0 via a cable, and the two connectors on the bridge are correspondingly connected to the C1 and C2 connectors on the GPU board respectively.

By means of the foregoing embodiments: 1) the number of connectors is reduced by replacing the original ×8 connector with ×16 connectors, thereby reducing the number of cables; 2) the design solution is simplified by adopting a board-to-board connector design; and 3) a bridge is introduced to enhance connection reliability and reduce operational steps when switching topologies. In addition, the side-by-side layout of the board-to-board connectors, together with the bridge equipped with matching connectors, effectively simplifies the board design and enables convenient switching between different topologies.

The content above are merely optional embodiments of the present disclosure and are not intended to limit the present disclosure. For a person skilled in the art, the present disclosure may have various modifications and variations. Any modifications, equivalent replacements, improvements, etc. made within the principle of the present disclosure shall fall within the scope of protection of the present disclosure.

The invention claimed is:

1. A circuit board of a graphics processing unit, wherein a connector set, a switch chip set, and a device slot set are deployed on the circuit board;

the connector set comprises a first connector, a second connector, a third connector, and a fourth connector, the switch chip set comprises a first switch chip and a second switch chip, and the device slot set comprises a first slot set and a second slot set, wherein the first slot set comprises (M+P) device slots, and the second slot set comprises N device slots, N is equal to (M+P);

the first switch chip is connected to the first connector, the third connector, and M device slots in the first slot set via traces of the circuit board respectively, the second switch chip is connected to the fourth connector and the N device slots in the second slot set via the traces of the circuit board respectively, and the second connector is connected to P device slots in the first slot set via the traces of the circuit board;

the first connector is configured to be connected to a first central processing unit; the second connector is configured to be connected to the third connector; the third connector is configured to be connected to the second connector or the fourth connector; the fourth connector is configured to be connected to the third connector or a second central processing unit; and the device slot set is configured to be connected to the graphics processing unit;

wherein the second connector, the third connector and the fourth connector are all board-to-board connectors, the second connector, the third connector and the fourth connector are arranged in a straight line, and face a same direction, and a distance between the second connector and the third connector, and a distance between the third connector and the fourth connector are both a target distance.

2. The circuit board according to claim 1, wherein connectors in the connector set are connected with each other via a connector circuit board, wherein a fifth connector and a sixth connector are deployed on a same side of the connector circuit board, the fifth connector and the sixth connector are connected via a trace of the circuit board, the fifth connector and the sixth connector are both board-to-board connectors, and a distance between the fifth connector and the sixth connector is the target distance.

3. The circuit board according to claim 2, wherein the connector circuit board is configured to slide on the circuit board of the graphics processing unit, to switch between, a connection between the third connector and the second connector, and a connection between the third connector and the fourth connector.

4. The circuit board according to claim 2, wherein the connector circuit board is configured to allow plugging and unplugging operations, to connect the third connector to the second connector, or connect the third connector to the fourth connector.

5. The circuit board according to claim 1, wherein connectors in the connector set are connected with each other via a connection cable comprising two connection heads, wherein a first connection head of the connection cable is connected to the third connector, and a second connection head of the connection cable is configured to be connected to the second connector or the fourth connector.

6. The circuit board according to claim 1, wherein the connection between the second connector and the third connector is configured to form a balanced topology structure or a common topology structure of the graphics processing unit.

7. The circuit board according to claim 6, wherein the second connector is connected to the third connector, and the first connector and the fourth connector are respectively connected to different central processing units, to form the balanced topology structure.

8. The circuit board according to claim 6, wherein the second connector is connected to the third connector, and the first connector and the fourth connector are connected to a same central processing unit, to form the common topology structure.

9. The circuit board according to claim 1, wherein the connection between the third connector and the fourth connector is configured to form a cascade topology structure of the graphics processing unit.

10. The circuit board according to claim 9, wherein the third connector is connected to the fourth connector, and the first connector is connected to the first central processing unit, to form the cascade topology structure.

11. The circuit board according to claim 1, wherein M is equal to (N−1), and P is equal to 1.

12. The circuit board according to claim 11, wherein N is equal to 5.

13. A server system, comprising: a central processing unit set, a circuit board of a graphics processing unit and a graphics processing unit set, wherein the circuit board of the graphics processing unit is connected between the central processing unit set and the graphics processing unit set;

a connector set, a switch chip set and a device slot set are deployed on the circuit board of the graphics processing unit, wherein the connector set comprises a first connector, a second connector, a third connector, and a fourth connector, the switch chip set comprises a first switch chip and a second switch chip, and the device slot set comprises a first slot set and a second slot set, wherein the first slot set comprises (M+P) device slots, and the second slot set comprises N device slots, N is equal to (M+P);

the first switch chip is connected to the first connector, the third connector, and M device slots in the first slot set via traces of circuit board respectively, the second switch chip is connected to the fourth connector and the N device slots in the second slot set via the traces of circuit board respectively, and the second connector is connected to P device slots in the first slot set via the traces of the circuit board;

the first connector is configured to be connected to a first central processing unit in the central processing unit set; the second connector is configured to be connected to the third connector; the third connector is configured to be connected to the second connector or the fourth connector; the fourth connector is configured to be connected to the third connector or a second central processing unit in the central processing unit set; and the device slot set is configured to be connected to a graphics processing unit in the graphics processing unit set;

wherein the second connector, the third connector and the fourth connector are all board-to-board connectors, the second connector, the third connector and the fourth connector are arranged in a straight line, and face a same direction, and a distance between the second connector and the third connector, and a distance between the third connector and the fourth connector are both a target distance.

14. The server system according to claim 13, wherein the second connector is connected to the third connector, the first connector is connected to the first central processing unit in the central processing unit set, and the fourth connector is connected to the second central processing unit in the central processing unit set, to form a balanced topology structure of the graphics processing unit set.

15. The server system according to claim 13, wherein the second connector is connected to the third connector, and the first connector and the fourth connector are both connected to a third central processing unit in the central processing unit set, to form a common topology structure of the graphics processing unit set.

16. The server system according to claim 13, wherein the third connector is connected to the fourth connector, and the first connector is connected to a fourth central processing unit in the central processing unit set, to form a cascade topology structure of the graphics processing unit set.

17. The server system according to claim 13, wherein the server system further comprises a connector circuit board, and connectors in the connector set are connected with each other via the connector circuit board, wherein a fifth connector and a sixth connector are deployed on a same side of the connector circuit board, the fifth connector and the sixth connector are connected via a trace of the circuit board, the fifth connector and the sixth connector are both board-to-board connectors, and a distance between the fifth connector and the sixth connector is the target distance.

18. The server system according to claim 17, wherein the connector circuit board is configured to slide on the circuit board of the graphics processing unit, to switch between, a connection between the third connector and the second connector, and a connection between the third connector and the fourth connector.

19. The server system according to claim 17, wherein the connector circuit board is configured to allow plugging and unplugging operations, to connect the third connector to the second connector, or connect the third connector to the fourth connector.

* * * * *